(12) United States Patent
Chen et al.

(10) Patent No.: US 8,263,458 B2
(45) Date of Patent: Sep. 11, 2012

(54) PROCESS MARGIN ENGINEERING IN CHARGE TRAPPING FIELD EFFECT TRANSISTORS

(75) Inventors: Tung-Sheng Chen, Cupertino, CA (US); Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 6 days.

(21) Appl. No.: 12/973,631

(22) Filed: Dec. 20, 2010

(65) Prior Publication Data

US 2012/0156856 A1   Jun. 21, 2012

(51) Int. Cl.
*H01L 21/336* (2006.01)

(52) U.S. Cl. .................. 438/257; 438/591; 257/E21.18; 257/E21.21; 257/E21.679; 257/E21.267

(58) Field of Classification Search .................. 438/201, 438/211, 257, 264, 585, 587, 588, 591, 592, 438/593, 594, 724, 744, 761, 762, 769, 770, 438/791, FOR. 222, FOR. 227, FOR. 388, 438/FOR. 395, FOR. 401; 257/E21.18, E21.21, 257/E21.423, E21.679, E21.267, E21.293

See application file for complete search history.

(56) References Cited

U.S. PATENT DOCUMENTS

| | | | |
|---|---|---|---|
| 4,870,470 A * | 9/1989 | Bass et al. | 257/324 |
| 6,498,064 B2 * | 12/2002 | Tseng | 438/257 |
| 6,808,992 B1 | 10/2004 | Ko et al. | |
| 6,927,129 B1 | 8/2005 | Sun et al. | |
| 6,943,401 B1 | 9/2005 | Fang | |
| 6,974,995 B1 | 12/2005 | Hui et al. | |
| 6,987,696 B1 | 1/2006 | Wang et al. | |
| 7,029,975 B1 | 4/2006 | Fang et al. | |
| 7,151,028 B1 | 12/2006 | Fang et al. | |
| 7,170,130 B2 | 1/2007 | Fang et al. | |
| 7,301,193 B2 | 11/2007 | Fang et al. | |
| 7,488,657 B2 | 2/2009 | Fang et al. | |
| 7,675,104 B2 | 3/2010 | Joshi et al. | |
| 7,732,276 B2 | 6/2010 | Fang et al. | |
| 7,829,936 B2 | 11/2010 | Shen et al. | |
| 7,851,306 B2 | 12/2010 | Fang et al. | |
| 2005/0199944 A1 | 9/2005 | Chen et al. | |
| 2006/0007752 A1 | 1/2006 | Wang et al. | |
| 2007/0037371 A1 | 2/2007 | Wang et al. | |
| 2008/0023750 A1 | 1/2008 | Xue et al. | |
| 2008/0083946 A1 | 4/2008 | Fang et al. | |
| 2008/0142874 A1 | 6/2008 | Fang et al. | |
| 2008/0149990 A1 | 6/2008 | Wang et al. | |
| 2008/0150000 A1 | 6/2008 | Suh et al. | |
| 2008/0150011 A1 | 6/2008 | Chan et al. | |

(Continued)

*Primary Examiner* — Michelle Estrada
*Assistant Examiner* — Quovaunda V Jefferson

(57) ABSTRACT

Embodiments of the present technology are directed toward charge trapping region process margin engineering for charge trapping field effect transistor. The techniques include forming a plurality of shallow trench isolation regions on a substrate, wherein the tops of the shallow trench isolation regions extend above the substrate by a given amount. A portion of the substrate is oxidized to form a tunneling dielectric region. A first set of one or more nitride layers are deposited on the tunneling dielectric region and shallow trench isolation regions, wherein a thickness of the first set of nitride layers is approximately half of the given amount that the tops of the shallow trench isolation regions extend above the substrate. A portion of the first set of nitride layers is etched back to the tops of the trench isolation regions. A second set of one or more nitride layers is deposited on the etched back first set of nitride layers. The second set of nitride layers is oxidized to form a charge trapping region on the tunneling dielectric region and a blocking dielectric region on the charge trapping region. A gate region is then deposited on the blocking dielectric region.

20 Claims, 11 Drawing Sheets

U.S. PATENT DOCUMENTS

| | | |
|---|---|---|
| 2008/0153224 A1 | 6/2008 | Wang et al. |
| 2008/0277712 A1 | 11/2008 | Ding et al. |
| 2009/0261406 A1 | 10/2009 | Suh et al. |
| 2009/0268500 A1 | 10/2009 | Fang et al. |
| 2009/0269916 A1 | 10/2009 | Kang et al. |
| 2009/0278173 A1 | 11/2009 | Fang et al. |
| 2009/0289369 A1 | 11/2009 | Fang et al. |
| 2010/0065940 A1 | 3/2010 | Kim et al. |
| 2010/0078814 A1 | 4/2010 | Roy et al. |
| 2010/0085811 A1 | 4/2010 | Suh et al. |
| 2010/0133646 A1 | 6/2010 | Fang et al. |
| 2010/0207191 A1 | 8/2010 | Fang et al. |
| 2010/0230743 A1 | 9/2010 | Fang et al. |
| 2010/0276746 A1 | 11/2010 | Fang et al. |

* cited by examiner

PROCESS MARGIN ENGINEERING IN CHARGE TRAPPING FIELD EFFECT TRANSISTORS

BACKGROUND OF THE INVENTION

Data storage devices are an important part of numerous electronic devices such as computers, smart phones, digital content players (e.g., MP3 players), game consoles, control systems, and the like. Many electronic devices include non-volatile solid state memory devices, such as flash memory. One common type of flash memory device is the charge trapping (CT) NAND integrated circuit (IC). FIG. 1 shows an exemplary CT-NAND based flash memory IC. The flash memory IC 100 includes a CT-NAND memory cell array 110, control circuits 120, column decoders 130, row decoders 140, input/output (I/O) buffers 150, and the like fabricated on a monolithic semiconductor substrate. The control circuits 120, column decoders 130, row decoders 140, I/O buffers 150, and the like operate to read and write data 160 at an address 170, 175 in the memory cell array 110 in accordance with various control signals 180 received by, internal to, and/or output from the flash memory IC 100. The circuits of the flash memory IC 100 is well known in the art and therefore those aspects of the flash memory IC 100 not particular to embodiments of the present technology will not be discussed further.

Referring now to FIG. 2, an exemplary memory cell array is shown. The CT-NAND memory cell array 110 includes a plurality of CT field effect transistors (FET) 210, a plurality of drain select gates 220, a plurality of source select gates 230, a plurality of bit lines 240, a plurality of word lines 250, a plurality of drain select signal lines 260, and a plurality of source select signal lines 270. Each column of the array 110 includes a drain select gate 220, a plurality of CT-FETs 210, and a source select gate 230 serially connected source to drain between a corresponding bit line 240 and a ground potential 280. The gates of each of a plurality of CT-FETs 210 in each row of the array 110 are coupled to a corresponding word line 250. The gate of each drain select gate 220 is connected to a corresponding drain select signal line 260. The gate of each source select gate 230 is connected to a corresponding drain select signal line 270. In one implementation, the CT-FETs may be silicon-oxide-nitride-oxide-silicon (SONOS) FETs or the like. The CT-NAND memory cell array 110 is well known in the art and therefore those aspects of the CT-NAND memory cell array 110 not particular to embodiments of the present technology will not be discussed further.

During fabrication of a CT-NAND memory cell array 110 there are variances in various processes. For example, the thickness of a deposited layer may vary from one wafer to another and from one region to another on a given wafer. Similarly, the amount of material removed by an etching process may vary from one wafer to another and from one region to another on a given wafer. Accordingly, there is a continued need for improved fabrication techniques that can compensate for process variances in one or more fabrication processes.

SUMMARY OF THE INVENTION

The present technology may best be understood by referring to the following description and accompanying drawings that are used to illustrate embodiments of the present technology directed toward process margin engineering for fabrication of charge trapping field effect transistors.

In one embodiment, a fabrication method includes forming a plurality of shallow trench isolation regions on a substrate. A tunneling dielectric region is also formed on a substrate. A first nitride layer is formed on the tunneling dielectric region and shallow trench isolation regions. A portion of the first nitride layer is etched back to the tops of the trench isolation regions. A second nitride layer is formed on the etched back first nitride layer. Portions of the first and second nitride layers are oxidized to form a charge trapping region on the tunneling dielectric region and a blocking dielectric region on the charge trapping region. A gate region is then formed on the blocking dielectric region.

In another embodiment, a fabrication method includes forming a plurality of shallow trench isolation regions on a substrate, wherein the tops of the shallow trench isolation regions extend above the substrate by a given amount. A tunneling dielectric region is formed on a substrate. A nitride layer is formed on the tunneling dielectric region and shallow trench isolation regions, wherein a thickness of the nitride layer is approximately half of a given amount that the tops of the shallow trench isolation regions extend above the substrate. A portion of the nitride layer is etched back to the tops of the trench isolation regions to form a charge trapping region between the trenches. A blocking dielectric region is formed on the charge trapping region, and a gate region is formed on the blocking dielectric region.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

In this application, the use of the disjunctive is intended to include the conjunctive. The use of definite or indefinite articles is not intended to indicate cardinality. In particular, a reference to "the" object or "a" object is intended to denote also one of a possible plurality of such objects.

Figure 1:
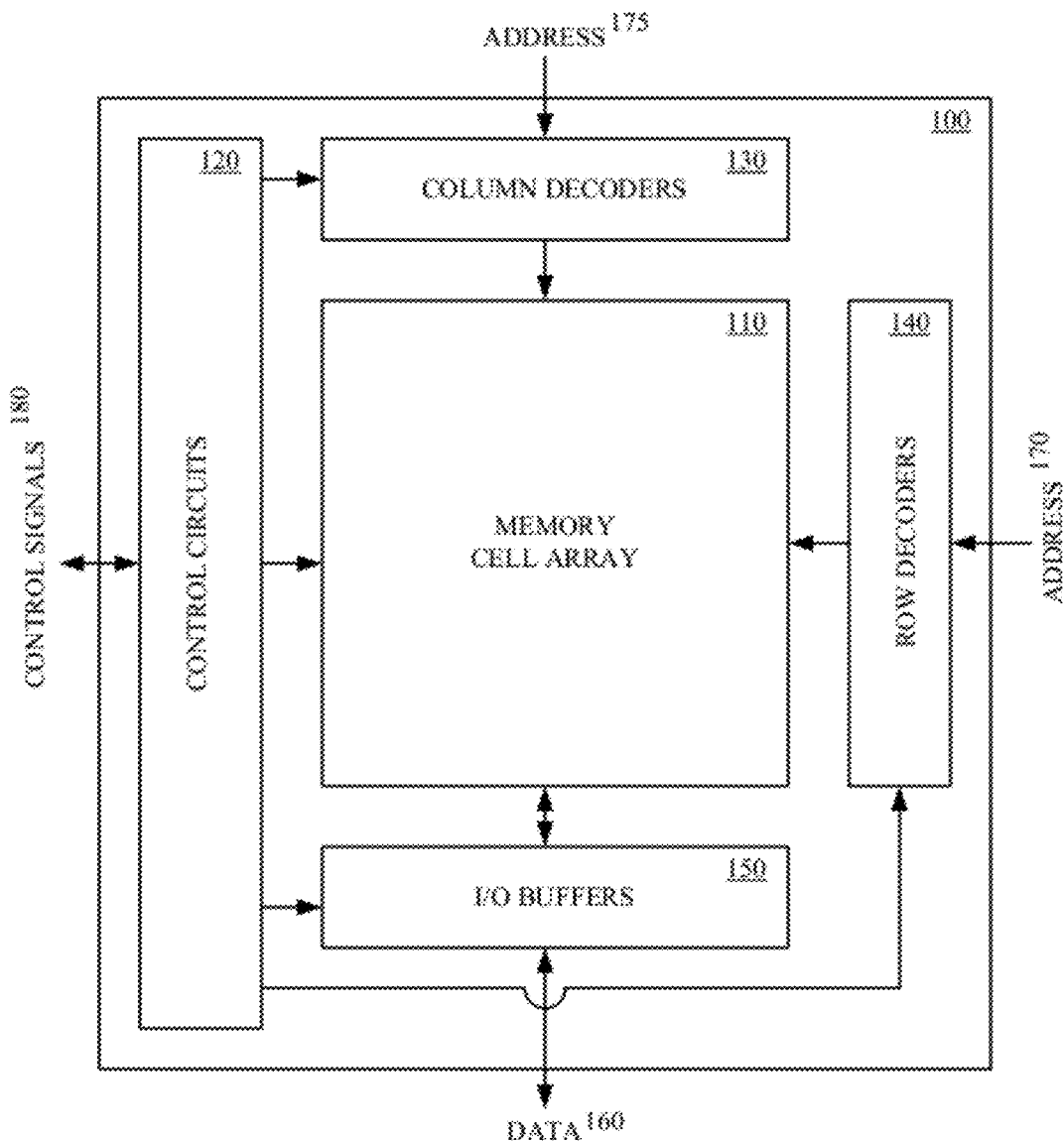
FIG. 1 shows a block diagram of an exemplary CT-NAND based flash memory IC according to the conventional art.
Figure 2:
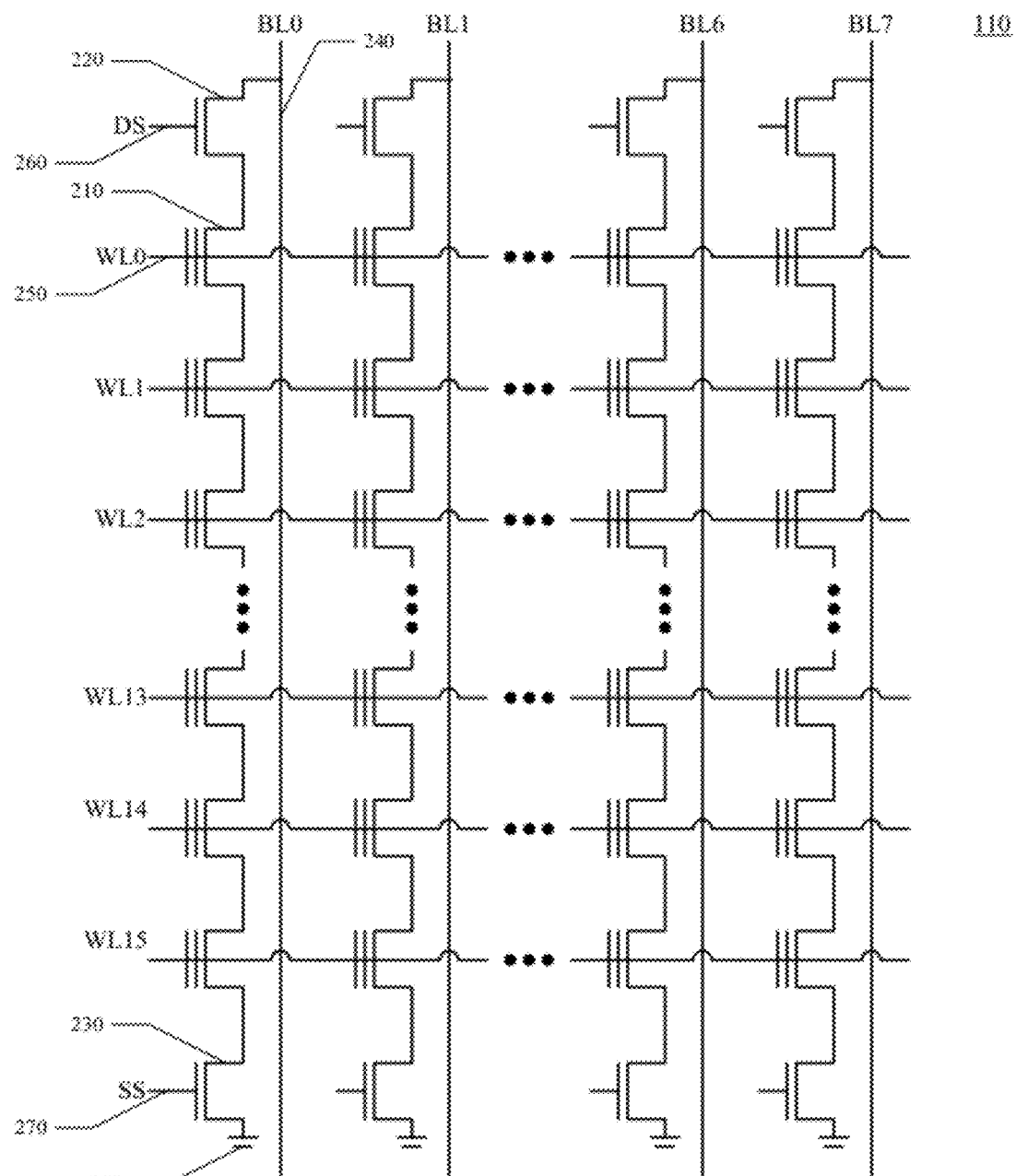
FIG. 2 shows a block diagram of an exemplary memory cell array according to the conventional art.
Figure 3:
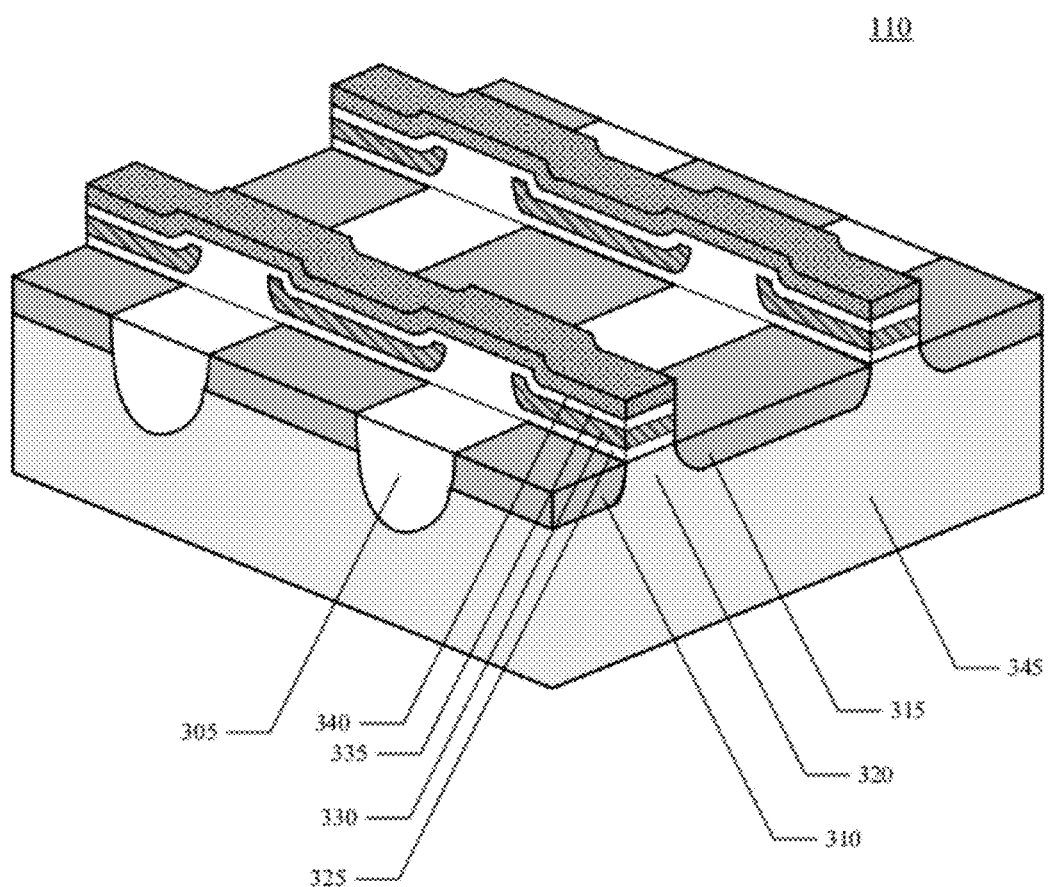
FIG. 3 shows a block diagram of a memory cell array structure, in accordance with one embodiment of the present technology.

Referring to FIG. 3, a memory cell array structure, in accordance with one embodiment of the present technology, is shown. In one implementation, the memory cell array may be a CT-NAND memory cell array 110. However, it is appreciated that embodiments of the present technology may be applied to any CT-FET device. In one implementation, each column of CT-FETs may be separated by a shallow trench isolation (STI) region 305. Each CT-FET may include a drain region 310, a source region 315, a channel region 320, a tunneling dielectric region 325 (also commonly referred to as a bottom dielectric region), a charge trapping region 330, a blocking dielectric region 335 (also commonly referred to as a top dielectric region), and a gate region 340. The source and drain regions 310, 315 may be semiconductor regions of the substrate 345 having a heavy doping concentration of a first type of impurity. In one implementation, the source and drain regions 310, 315 may be silicon heavily doped with phosphorous or arsenic. The channel region 320 may be a semiconductor region of the substrate 345 having moderate doping concentration of a second type of impurity, disposed laterally between the source and drain regions 310, 315. In one implementation, the channel region 320 may be silicon moderately doped with boron. The tunneling dielectric region 325 may be a dielectric layer disposed over the channel region 320 and adjacent portions of the source and drain regions 310, 315. In one implementation, the tunneling dielectric region 325 may be silicon oxide, oxynitride, silicon oxynitride, or the like layer. The charge trapping region 330 may be a dielectric, semiconductor or the like layer disposed between the tunneling dielectric region 325 and the blocking dielectric region 335. In one implementation, the charge trapping region 330 may be a nitride, silicon-rich-nitride, or the like layer. The blocking dielectric region 335 may be a dielectric layer disposed between the charge trapping region 330 and the gate region 340. In one implementation, the blocking dielectric region 335 may be a silicon oxide, oxynitride, silicon oxynitride, or the like layer. The gate region 340 may be a semiconductor or a conductor layer disposed on the blocking dielectric region 335 opposite the charge trapping region 330. In one implementation, the gate region 340 may be a polysilicon layer having a heavy doping concentration of the first type of impurity.

Figure 4A:
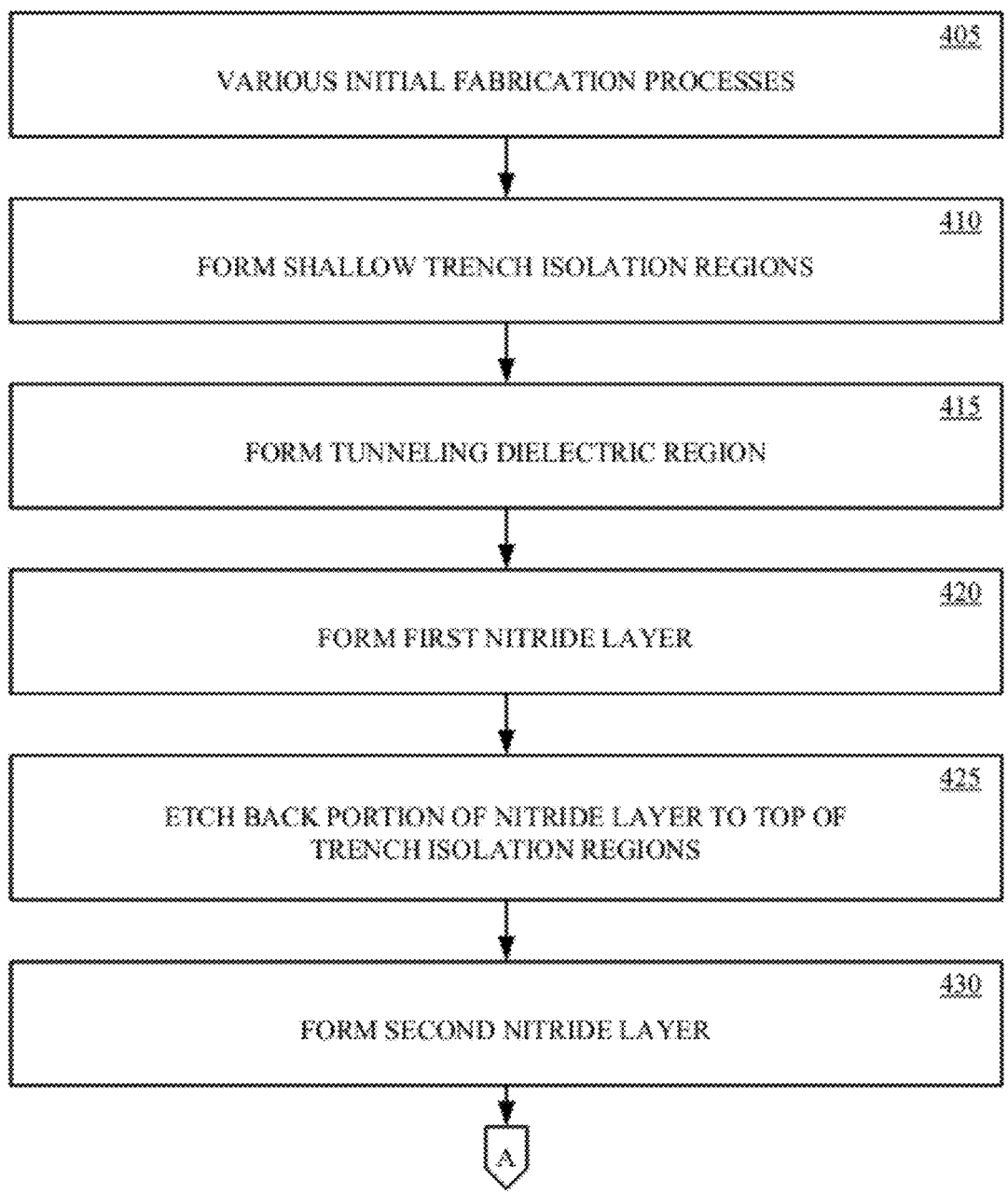
FIGS. 4A and 4B show a flow diagram of a method of fabricating a charge trapping field effect transistor, in accordance with one embodiment of the present technology.
Figure 4B:
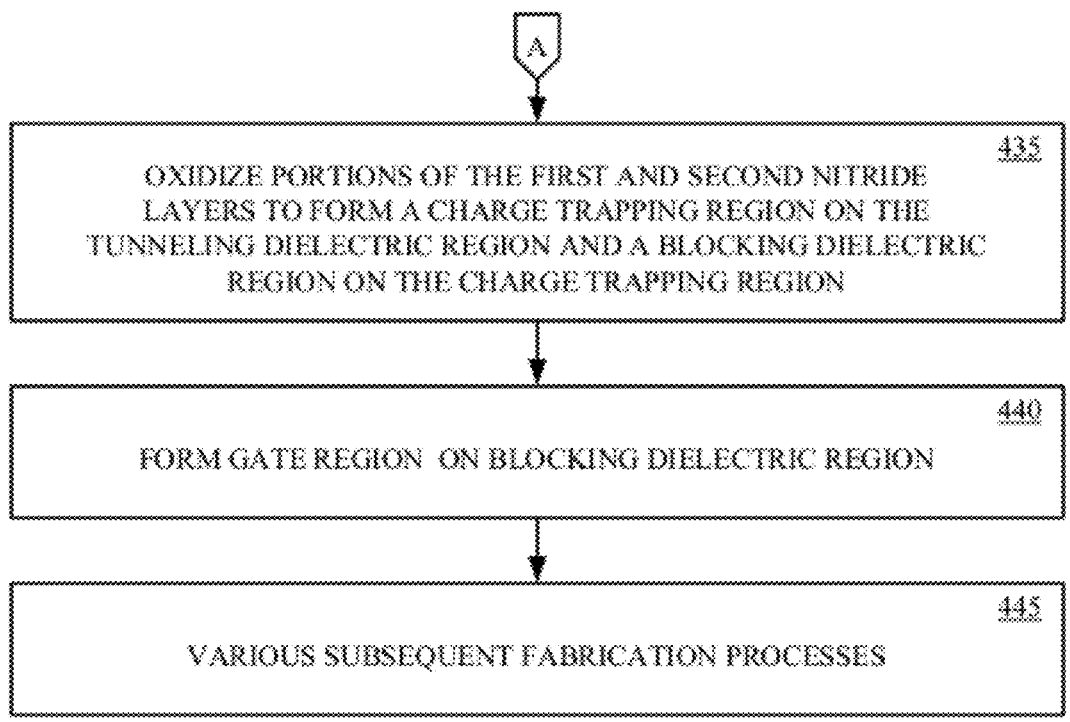
Figure 5A:
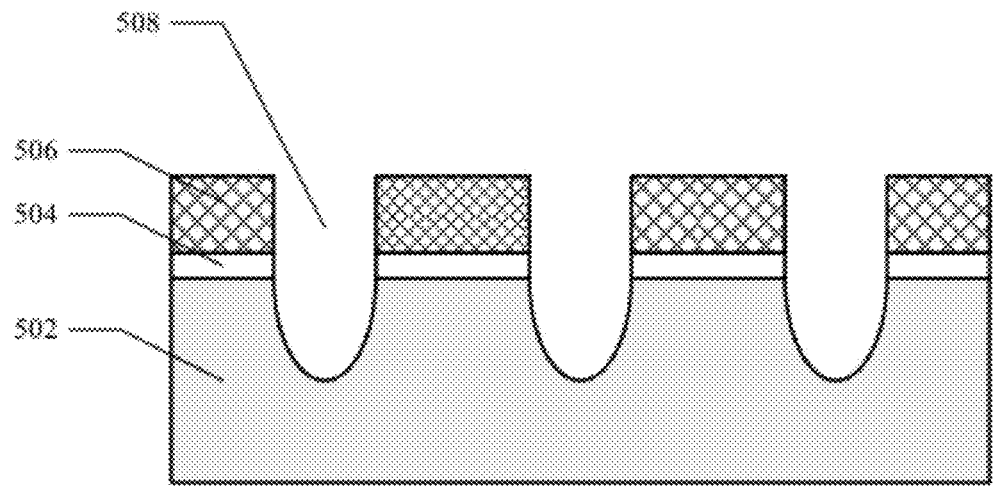
FIGS. 5A-5I show block diagrams illustrating fabrication of a charge trapping field effect transistor, in accordance with one embodiment of the present technology.

Referring now to FIGS. 4A-4B, a method of fabricating a CT-FET, in accordance with one embodiment of the present technology, is shown. The method of fabricating the CT-FET will be further explained with reference to FIGS. 5A-5I, which illustrates fabrication of the CT-FET, in accordance with one embodiment of the present technology. As depicted in FIGS. 4A and 5A, the process begins, at 405, with various initial processes upon a semiconductor wafer substrate 502, such as cleaning, depositing, doping, etching and/or the like to form one or more regions. The substrate 502 may be a semiconductor doped at a first concentration with a first dopant type. In one implementation, the substrate 502 may be silicon moderately doped with boron (P).

Figure 5B:
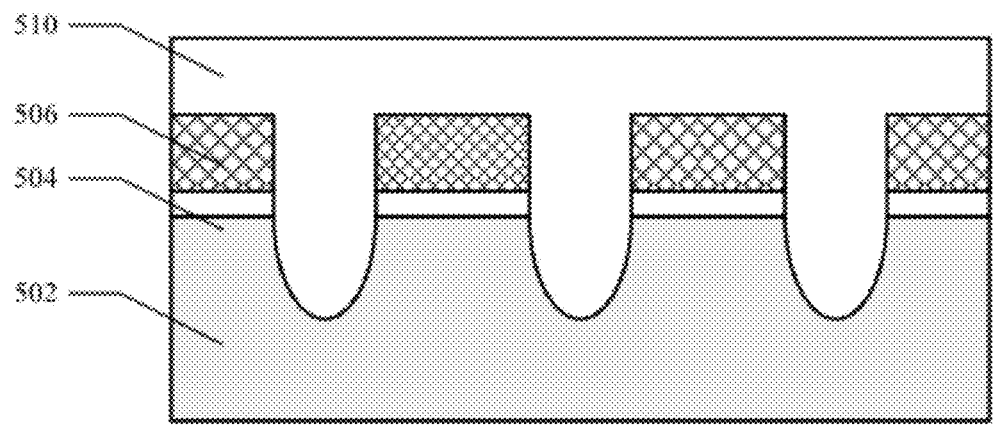
Figure 5C:
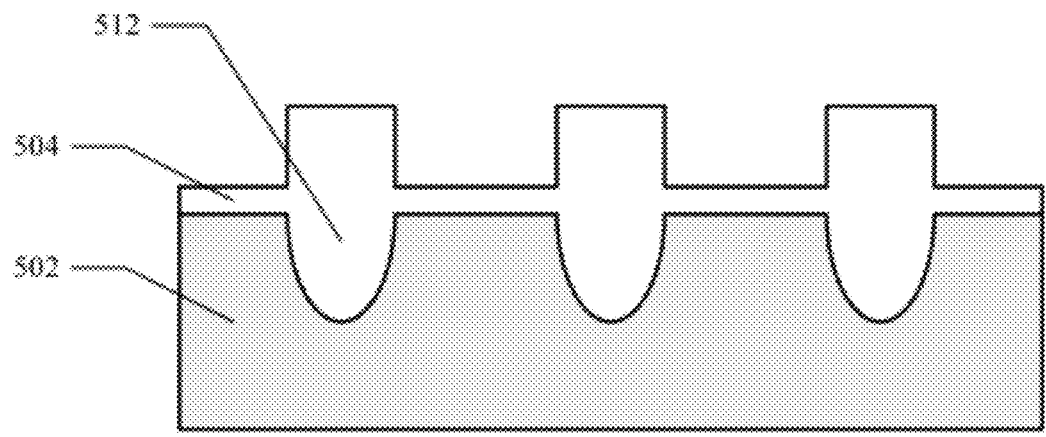

At 410, a plurality of shallow trench isolation regions are formed. In one implementation, a sacrificial oxide 504 may be formed on the substrate 502 by any well known oxidation process. A photo resist is then deposited on the sacrificial oxide and patterned by any well known photolithography process to form a shallow trench isolation (STI) mask 506. The substrate 502 and sacrificial oxide 504 in the memory cell array region exposed by the STI mask 506 is then selectively etched by any well known etching process to form a plurality of trenches 508. Referring now to FIG. 5B, the trenches 508 may be filled with a dielectric 510. In one implementation, a conformal oxide, spin on glass or the like is deposited. Referring now to FIG. 5C, the dielectric layer 510 may then be etched back, by any well known etching process or chemical mechanical polishing (CMP) process, to form shallow trench isolation regions 512 having a portion that extends above the substrate by a given amount commonly referred to a STI mesa. The STI mask 506 may then be removed by any well known process such as resist striping or resist ashing. The sacrificial oxide 504 may also be removed by any well known selective etching process.

Figure 5D:
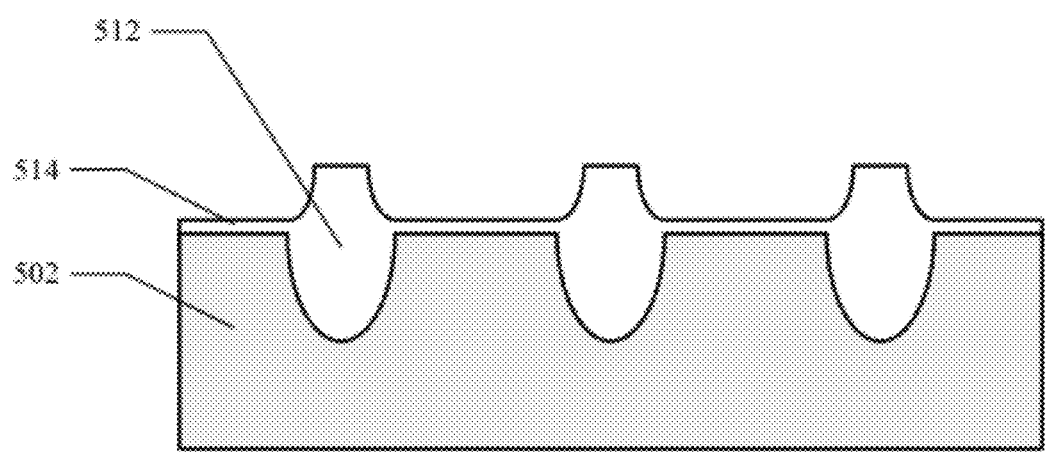

Referring now to FIG. 5D, a tunneling dielectric region 514 is formed on the substrate 502, at 415. In one implementation, the tunneling dielectric region 514 may be formed by oxidizing the exposed surface of the substrate 502 in the memory cell array region by any well known thermal oxidation process. In another implementation, the tunneling dielectric region 514 may be formed by depositing a silicon oxynitride film by any well known chemical vapor deposition process. In one implementation, the tunneling dielectric region 514 may be formed to a thickness of about 3 to 8 nanometers.

Figure 5E:
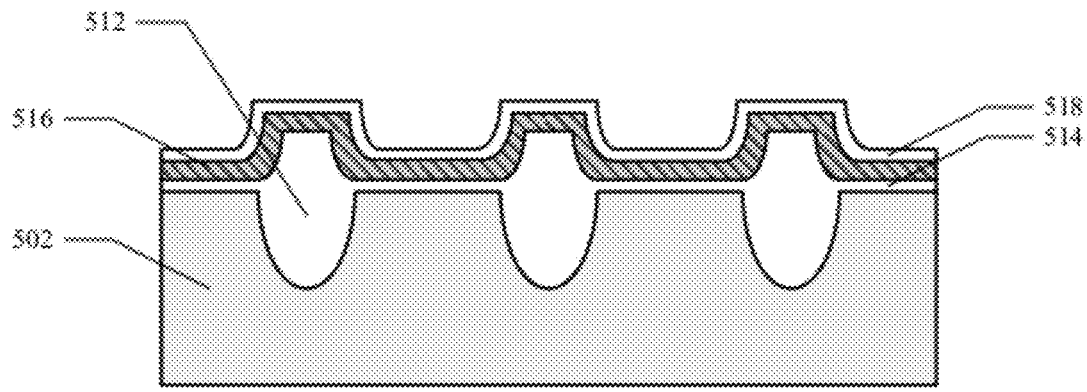

Referring now to FIG. 5E, a first set of one or more nitride and/or the like layers 516 is formed on the tunneling dielectric region 514, at 420. In one implementation, the first set of one or more nitride or the like layers 516 is formed by depositing a nitride and/or the like by any well known process such as chemical vapor deposition (CVD) or atomic layer deposition (ALD), on the tunneling dielectric region 514. The first nitride or the like layer 516 may include silicon-rich-nitride having an atomic ratio of silicon to nitrogen that is about 3:4 or greater. In one implementation, the thickness of the first set of one or more nitride and/or the like layers may have a thickness that is approximately one third to two thirds of the height that the tops of the shallow trench isolation regions extend above the substrate. A sacrificial oxide layer 518 may be formed on the first nitride layer 516 by any well known process such as oxidation.

Figure 5F:
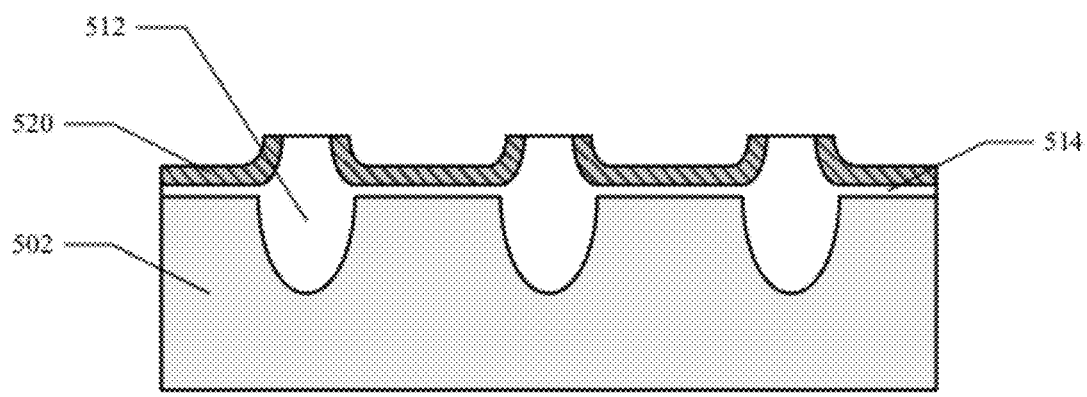

Referring now to FIG. 5F, a portion of the first set of one or more nitride and/or the like layers and a portion of the sacrificial oxide layer are etched back 520 to the tops of the shallow trench isolation regions 512, at 425. The remaining portion of the sacrificial oxide layer is then removed after the etch-back process.

Figure 5G:
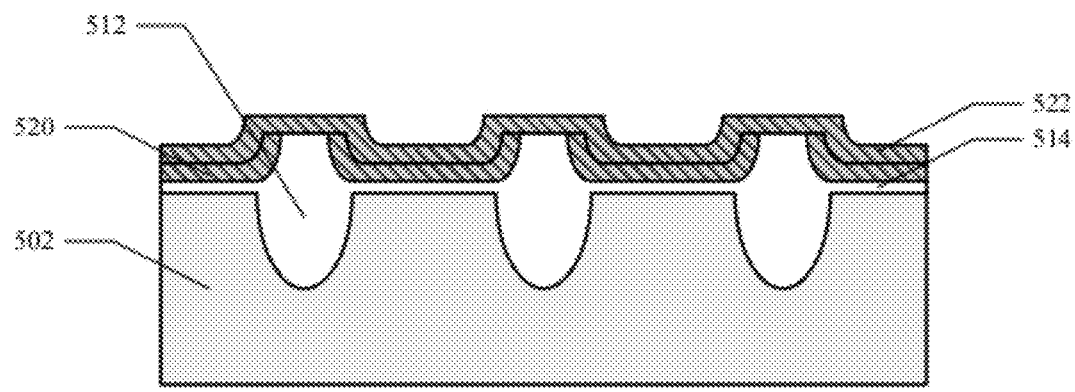

Referring now to FIG. 5G, a second set of one or more nitride and/or the like layers 522 is formed on the etched back first set of one or more nitride and/or the like layers 520, at 430. In one implementation, the second set of one or more nitride and/or the like layers 522 is formed by depositing a nitride or the like by any well known process such as chemical vapor deposition (CVD), on the etched back first set of nitride or the like layer 520. The second set of nitride or the like layer 522 may include silicon-rich-nitride having an atomic ratio of silicon to nitrogen that is about 3:4 or greater.

Figure 5H:
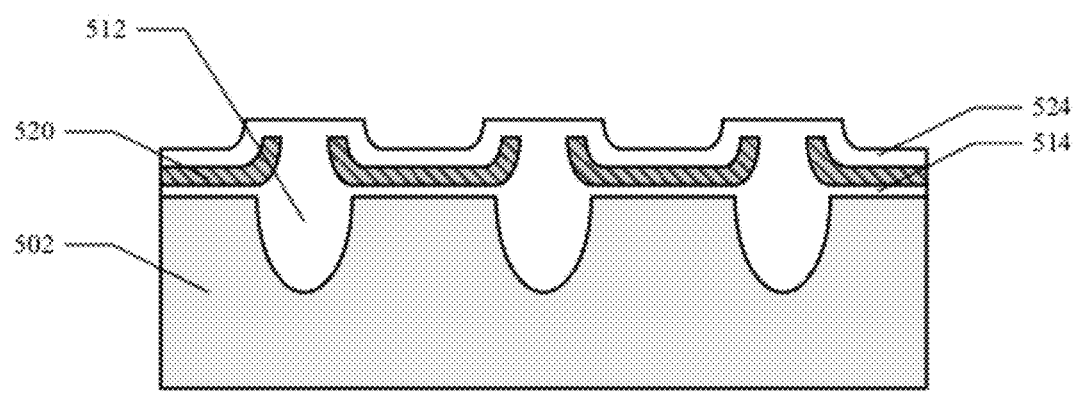

Referring not to FIGS. 4B and 5H, portions of the first and second nitride or the like layers 520, 522, are oxidized to form a charge trapping region 524 on the tunneling dielectric region 514 and a blocking dielectric region 526 on the charge trapping region 524, at 435. In one implementation, the nitride or silicon-rich-nitride 520, 522 is oxidized down to the tops of the shallow trench isolation region 512 to form oxynitride or silicon oxynitride. In one implementation, the resulting charge trapping region 524 may be formed to a thickness of about 4 to 15 nanometers and the resulting blocking dielectric region 524 may be formed to a thickness of about 3 to 8 nanometers.

The use of a relatively thin first and second nitride or the like layers advantageously increases the etch back process margin. For the purpose of scaling the CT-FET, the process of depositing a thin first nitride or the like layer, etching back a portion thereof, depositing a thin second nitride or the like layer and oxidizing, advantageously reduces the wing height of the charge trapping region proximate the STI regions and reduces inter-cell coupling/interference. Furthermore, because the thin second nitride or the like layer is consumed to form the blocking dielectric region, there is no additional process complications or etch back needed.

In another implementation, the processes of forming a second nitride layer and oxidization thereof at 430-435 may be eliminated. Instead, the etched back first nitride layer may form the charge trapping region and a dielectric may be deposited to form the blocking dielectric region.

Figure 5I:
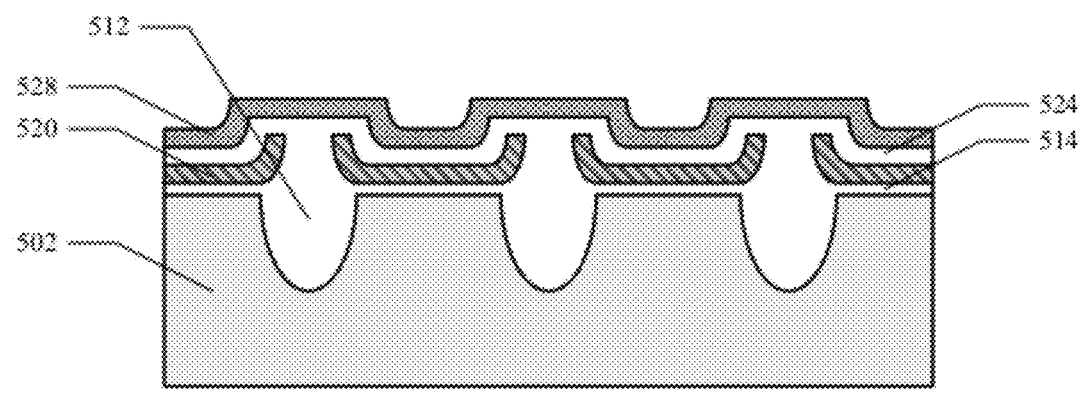

Referring now to FIG. 5I, a gate region 528 is formed on the blocking dielectric region 524, at 440. In one implementation, a polysilicon layer 528 is deposited, by any well known process such as chemical vapor deposition, on the oxynitride or silicon oxynitride layer 526.

At 445, the process continues with various subsequent processes, such as implanting, doping, etching, cleaning and/or the like, to further form the charge trapping, blocking dielectric, and gate regions and/or one or more additional regions, such as gate, source and drain contacts, peripheral circuits, interconnects, vias, passivation layer and/or the like. It is appreciated that the above described method of fabricating a CT-FET may also include other additional processes and that the order of the processes may vary from the order described above.

Figure 6A:
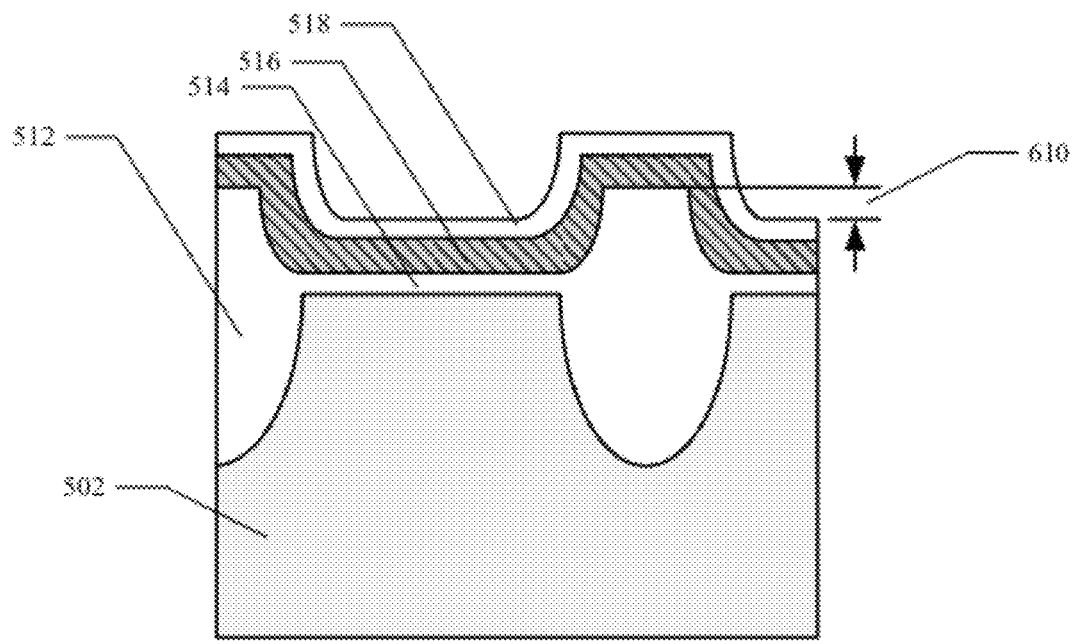
FIGS. 6A and 6B show block diagrams illustrating the difference in process fabrication margins for a thin nitride layer and a thick nitride layer used for a charge trapping region, in accordance with one embodiment of the present technology.
Figure 6B:
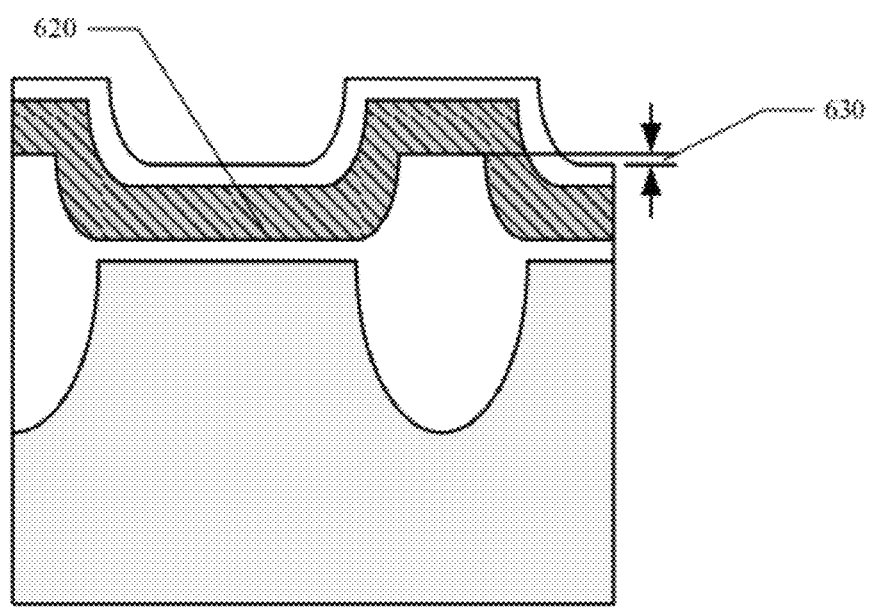

Referring now to FIGS. 6A and 6B, exemplary gate stacks manufactured using thin and thick nitride or the like layers is shown. FIG. 6A illustrates the gate stack of a CT-FET fabricated by depositing a thin first nitride or the like layer 516 that will then be partially etched back before a thin second nitride or the like layer is deposited and oxidized. The etch back process margin is illustrated at 610. FIG. 6B illustrates the gate stack fabricated by depositing a thick nitride or the like layer 620 that will then be partially etched back before it is partially oxidized. The smaller etch back process margin for the single thick nitride or the like layer 620 is illustrated at 630. The larger process margin 610 of embodiments of the present technology illustrated in FIG. 6A as compared to FIG. 6B compensates for other process variances, thereby advantageously improving fabrication and performance of the CT-FET. For instance, the process of depositing a thin first nitride or the like layer 516, etching back a portion thereof, depositing a thin second nitride or the like layer and oxidizing, advantageously reduces the wing height of the charge trapping region proximate the STI regions and reduces inter-cell coupling/interference.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method comprising:
    forming a plurality of shallow trench isolation regions on a substrate;
    forming a tunneling dielectric region on a substrate;
    forming a first nitride layer on the tunneling dielectric region and shallow trench isolation regions;
    etching back a portion of the first nitride layer to the tops of the trench isolation regions;
    forming a second nitride layer on the etched back first nitride layer;
    oxidizing portions of the first and second nitride layers to form a charge trapping region on the tunneling dielectric region and a blocking dielectric region on the charge trapping region; and
    forming a gate region on the blocking dielectric region.

2. The method according to claim 1, wherein the first nitride layer comprises a silicon-rich-nitride layer.

3. The method according to claim 1, wherein the second nitride layer comprises a silicon-rich-nitride layer.

4. The method according to claim 1, wherein the charge trapping region comprises silicon nitride.

5. The method according to claim 1, wherein the tunneling dielectric region comprises silicon oxide.

6. The method according to claim 1, wherein the blocking dielectric region comprises silicon oxynitride.

7. The method according to claim 1, wherein the blocking dielectric region comprises oxynitride.

8. A method comprising:
    forming a plurality of shallow trench isolation regions on a substrate, wherein the tops of the shallow trench isolation regions extend above the substrate by a given amount;
    oxidizing a portion of the substrate to form a blocking dielectric region;
    depositing a first set of one or more nitride layers on the blocking dielectric region and shallow trench isolation regions, wherein a thickness of the first set of nitride layers is approximately half of the given amount;
    etching back a portion of the first set of one or more nitride layers to the tops of the trench isolation regions;
    depositing a second set of one or more nitride layers on the etched back first set of one or more nitride layers;
    oxidizing the second set of one or more nitride layers to form a charge trapping region on the tunneling dielectric region and a blocking dielectric region on the charge trapping region; and
    depositing a gate region on the blocking dielectric region.

9. The method according to claim 8, wherein forming the shallow trench isolation regions comprises:
    etching a plurality of trenches;
    depositing a dielectric layer in the trenches; and
    etching back the dielectric layer to form the shallow trench isolation regions in the trenches.

10. The method according to claim 8, wherein depositing the first set of one or more nitride layers comprises chemical vapor depositing a first silicon-rich-nitride layer.

11. The method according to claim 10, wherein depositing the second set of one or more nitride layers comprises chemical vapor depositing a second silicon-rich-nitride layer.

12. The method according to claim 8, wherein the charge trapping region comprises silicon nitride.

13. The method according to claim 8, wherein the blocking dielectric region comprises silicon oxynitride.

14. The method according to claim 8, wherein the blocking dielectric region comprises oxynitride.

15. A method comprising:
    forming a plurality of shallow trench isolation regions on a substrate having a mesa height that extends above the substrate by a given amount;
    forming a tunneling dielectric region on a substrate;
    forming a first nitride layer on the tunneling dielectric region and shallow trench isolation regions, wherein a thickness of the first nitride layer is approximately half of given amount;
    etching back a portion of the first nitride layer to the tops of the mesas of the trench isolation regions to form a charge trapping region between the trenches;
    forming a second nitride layer on the charge trapping region and the tops of the mesas of the trench isolation regions;
    oxidizing the second nitride layer to form a blocking dielectric region on the charge trapping region; and
    forming a gate region on the blocking dielectric region.

16. The method according to claim 15, wherein forming the first nitride layer comprises chemical vapor depositing a silicon-rich-nitride layer.

17. The method according to claim 15, wherein forming the second nitride layer comprises chemical vapor depositing a silicon nitride or silicon oxynitride layer.

18. The method according to claim 15, wherein forming the gate region comprises chemical vapor depositing a polysilicon.

19. The method according to claim 15, wherein forming the tunneling dielectric region comprises oxidizing a portion of the substrate.

20. The method according to claim 15, wherein forming the shallow trench isolation regions comprises:
    etching a plurality of trenches;
    depositing a dielectric layer in the trenches; and
    etching back the dielectric layer to form the shallow trench isolation regions in the trenches.

* * * * *